(12) United States Patent
Saito

(10) Patent No.: US 11,736,039 B2
(45) Date of Patent: Aug. 22, 2023

(54) CONTROL METHOD FOR PIEZOELECTRIC DRIVE DEVICE AND CONTROL METHOD FOR MANIPULATOR

(71) Applicant: SEIKO EPSON CORPORATION, Tokyo (JP)

(72) Inventor: Hidetoshi Saito, Suwa-Gun Fujimi-Machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 122 days.

(21) Appl. No.: 17/520,760

(22) Filed: Nov. 8, 2021

(65) Prior Publication Data
US 2022/0149754 A1 May 12, 2022

(30) Foreign Application Priority Data

Nov. 9, 2020 (JP) .................................. 2020-186344

(51) Int. Cl.
*H02N 2/10* (2006.01)
*H02N 2/00* (2006.01)
*H10N 30/80* (2023.01)

(52) U.S. Cl.
CPC ........... *H02N 2/103* (2013.01); *H02N 2/0075* (2013.01); *H10N 30/802* (2023.02)

(58) Field of Classification Search
CPC ...... H02N 2/103; H02N 2/0075; H02N 2/004; H02N 2/006; H02N 2/003; H10N 30/802; B25J 9/126; B25J 9/16
See application file for complete search history.

(56) References Cited

U.S. PATENT DOCUMENTS

| | | | |
|---|---|---|---|
| 10,589,424 B2 * | 3/2020 | Nammoto | ............. B25J 9/0087 |
| 2006/0061235 A1 * | 3/2006 | Funakubo | ............. H02N 2/103 |
| | | | 310/323.16 |
| 2009/0256445 A1 | 10/2009 | Kotani et al. | |
| 2020/0036302 A1 | 1/2020 | Saito | |

FOREIGN PATENT DOCUMENTS

| | | |
|---|---|---|
| JP | 2009254198 A | 10/2009 |
| JP | 2020018079 A | 1/2020 |

* cited by examiner

*Primary Examiner* — Emily P Pham
(74) *Attorney, Agent, or Firm* — Yu Gang

(57) ABSTRACT

A control method for a piezoelectric drive device having a vibrating portion including a piezoelectric element and a transmitting portion, synthesizing longitudinal vibration and flexural vibration by energization to the piezoelectric element to vibrate the vibrating portion and make elliptic motion of the transmitting portion, and moving a driven member by the elliptic motion of the transmitting portion, includes controlling a movement amount of the driven member by changing amplitude of the longitudinal vibration with amplitude of the flexural vibration kept constant.

10 Claims, 10 Drawing Sheets

US 11,736,039 B2

CONTROL METHOD FOR PIEZOELECTRIC DRIVE DEVICE AND CONTROL METHOD FOR MANIPULATOR

The present application is based on, and claims priority from JP Application Serial Number 2020-186344, filed Nov. 9, 2020, the disclosure of which is hereby incorporated by reference herein in its entirety.

BACKGROUND

1. Technical Field

The present disclosure relates to a control method for a piezoelectric drive device and a control method for a manipulator.

2. Related Art

For example, an ultrasonic motor disclosed in JP-A-2009-254198 has a rotor 2 rotatable around a rotation axis and an ultrasonic vibrator pressed against the outer circumferential surface of the rotor 2. Further, the ultrasonic vibrator has a vibrating portion and a contact portion provided in the distal end part of the vibrating portion and contacting the outer circumferential surface of the rotor 2. In the ultrasonic motor, longitudinal vibration and flexural vibration are simultaneously generated in the vibrating portion, the contact portion makes elliptic motion, the rotor is turned around the rotation axis by the elliptic motion, and the rotor rotates.

However, in the ultrasonic motor disclosed in JP-A-2009-254198, the longitudinal vibration and the flexural vibration are simultaneously generated in the vibrating portion for rotation of the rotor, and there is a problem that micro control of the rotation amount of the rotor is difficult.

SUMMARY

A control method for a piezoelectric drive device according to an aspect of the present disclosure is a control method for a piezoelectric drive device including a vibrating portion having a piezoelectric element and a transmitting portion, synthesizing longitudinal vibration and flexural vibration by energization to the piezoelectric element to vibrate the vibrating portion and make elliptic motion of the transmitting portion, and moving a driven member by the elliptic motion, including controlling a movement amount of the driven member by changing amplitude of the longitudinal vibration with amplitude of the flexural vibration kept constant.

A control method for a manipulator according to an aspect of the present disclosure is a control method for a manipulator having a vibrating portion including a piezoelectric element and a transmitting portion, synthesizing longitudinal vibration and flexural vibration by energization to the piezoelectric element to vibrate the vibrating portion and make elliptic motion of the transmitting portion, and relatively moving a first member and a second member mutually coupled by the elliptic motion, including controlling a relative movement amount of the first member and the second member by changing amplitude of the longitudinal vibration with amplitude of the flexural vibration kept constant.

DESCRIPTION OF EXEMPLARY EMBODIMENTS

As below, a control method for a piezoelectric drive device and a control method for a manipulator according to the present disclosure will be explained in detail with reference to preferred embodiments shown in the accompanying drawing.

First Embodiment

Figure 1:
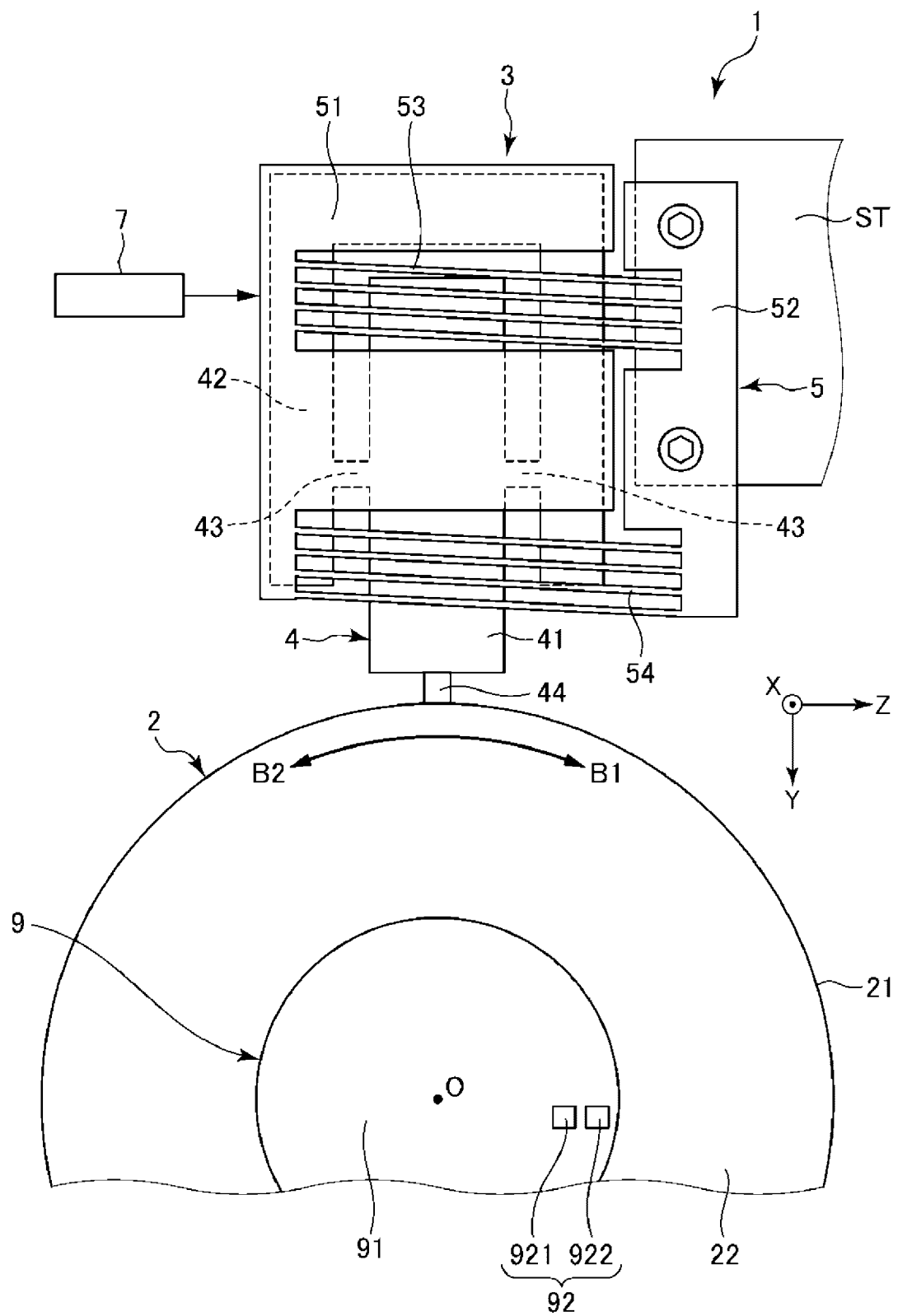
FIG. 1 is a plan view showing a piezoelectric motor according to a first embodiment of the present disclosure.
Figure 2:
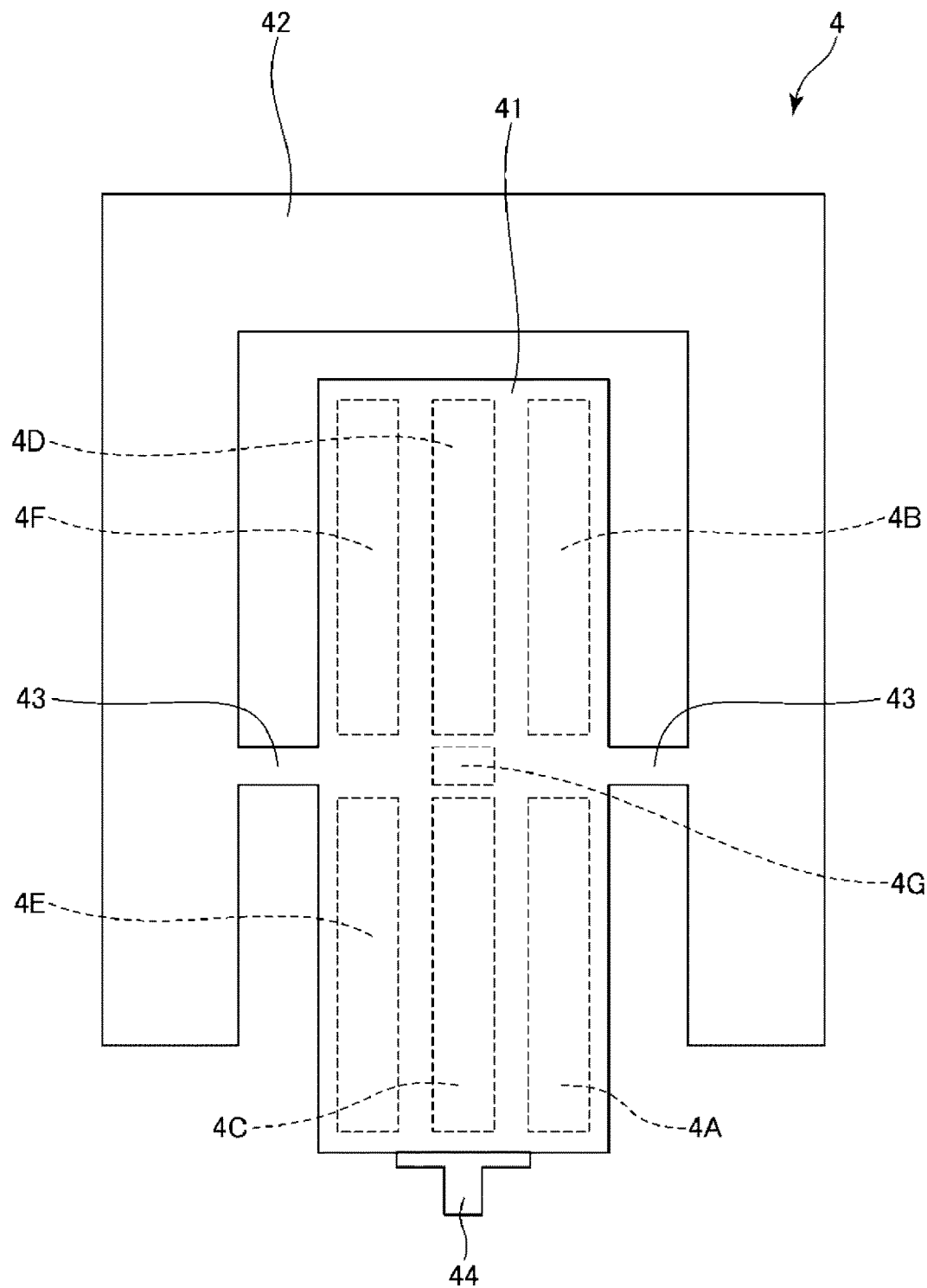
FIG. 2 is a plan view showing a piezoelectric actuator of the piezoelectric motor.
Figure 3:
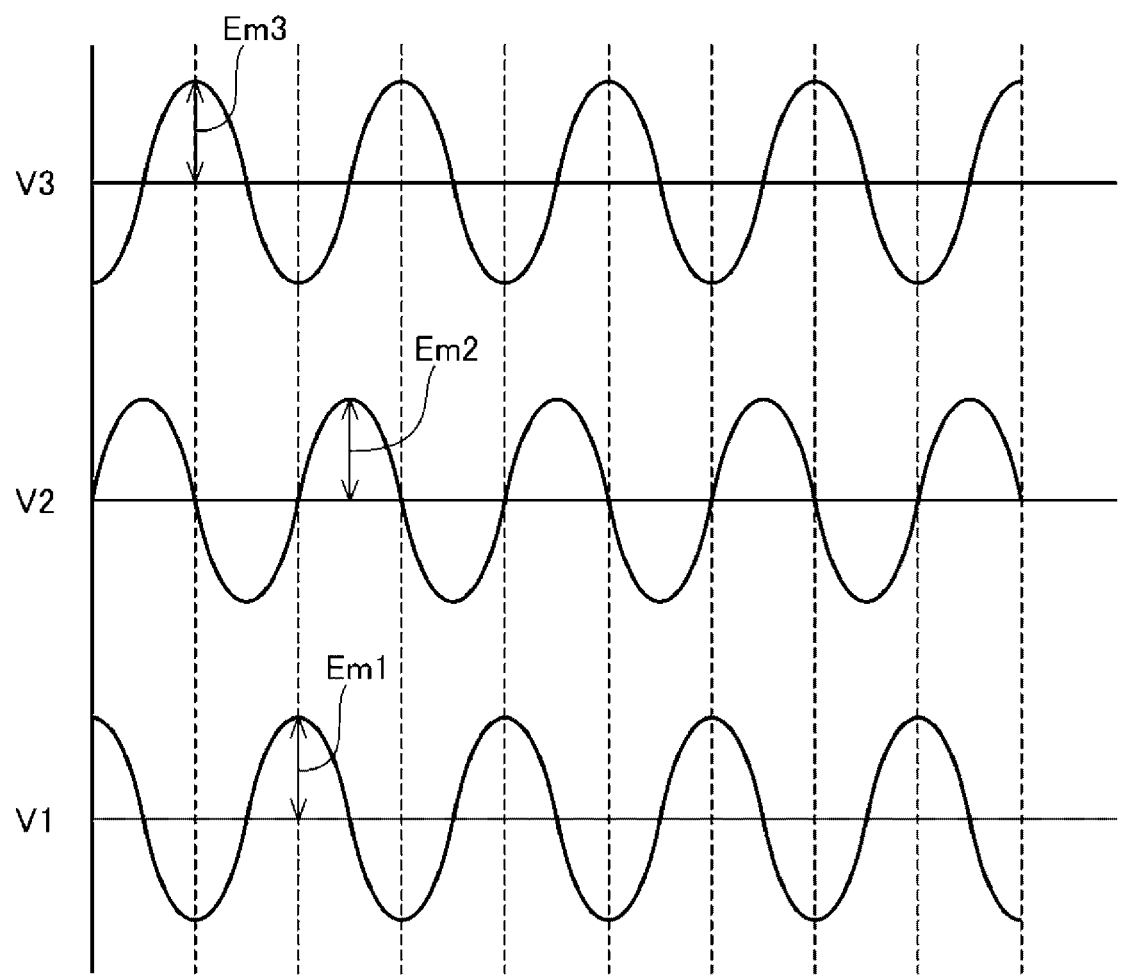
FIG. 3 shows drive signals applied to the piezoelectric actuator.
Figure 4:
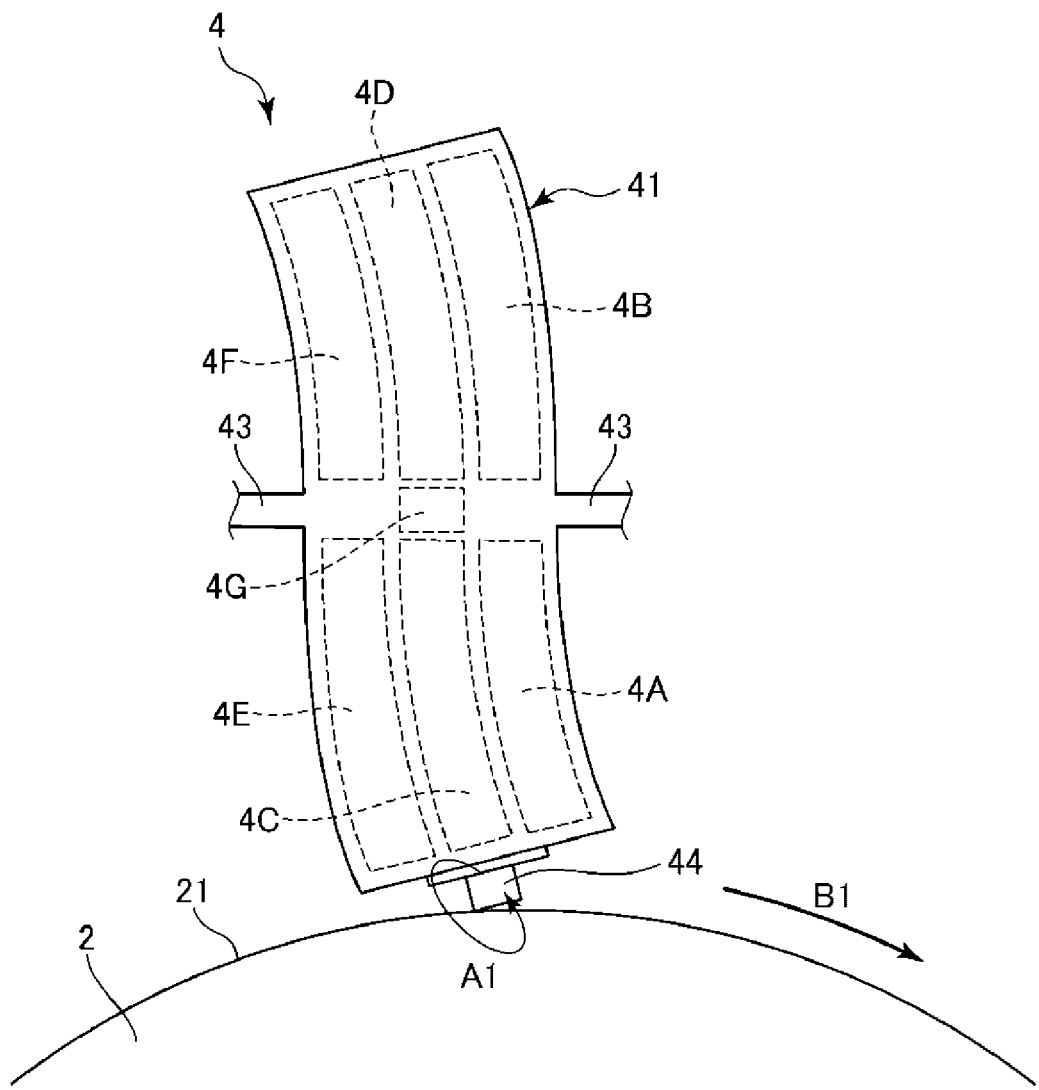
FIG. 4 is a plan view showing a drive state of the piezoelectric actuator.
Figure 4:
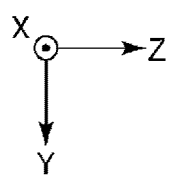
Figure 5:
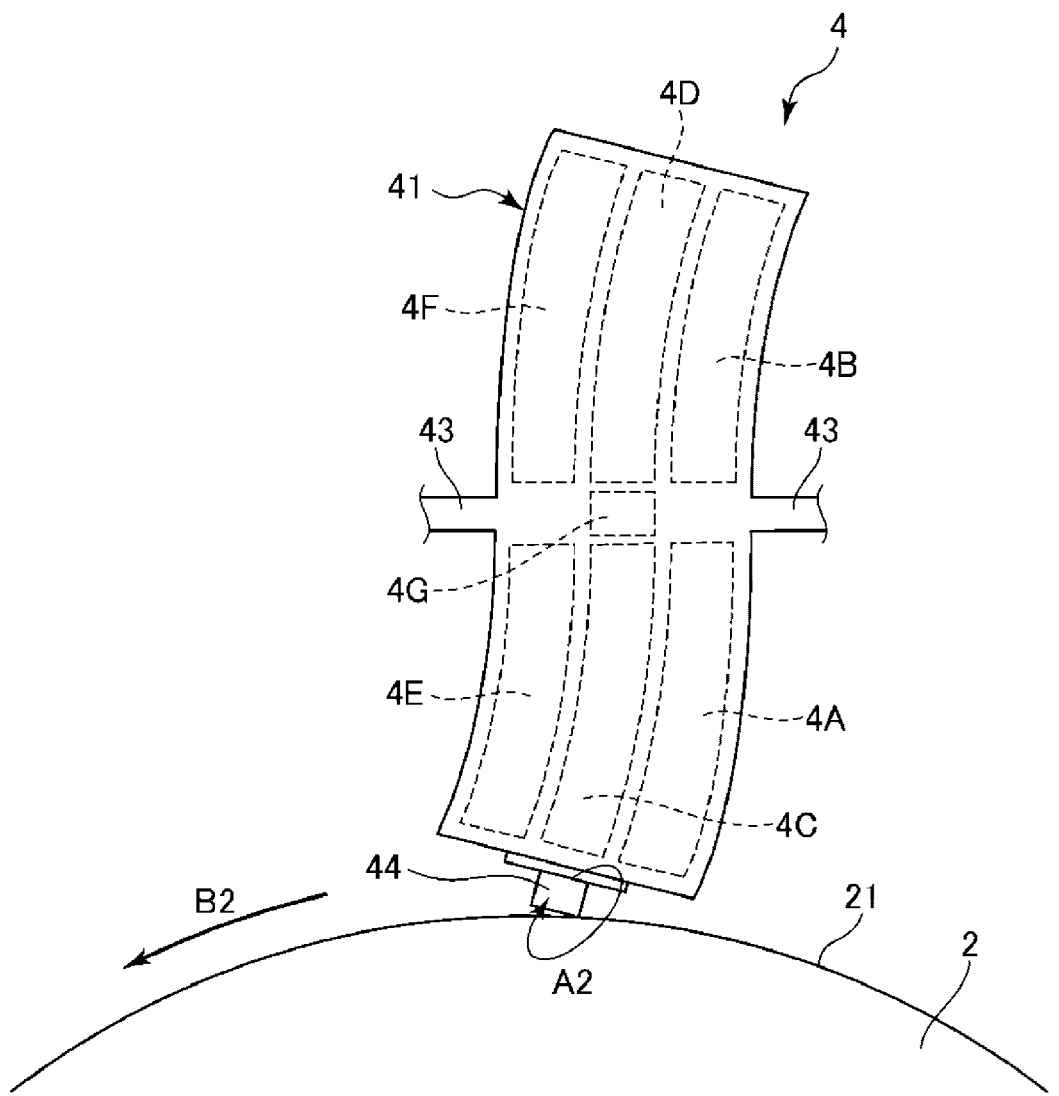
FIG. 5 is a plan view showing a drive state of the piezoelectric actuator.
Figure 6:
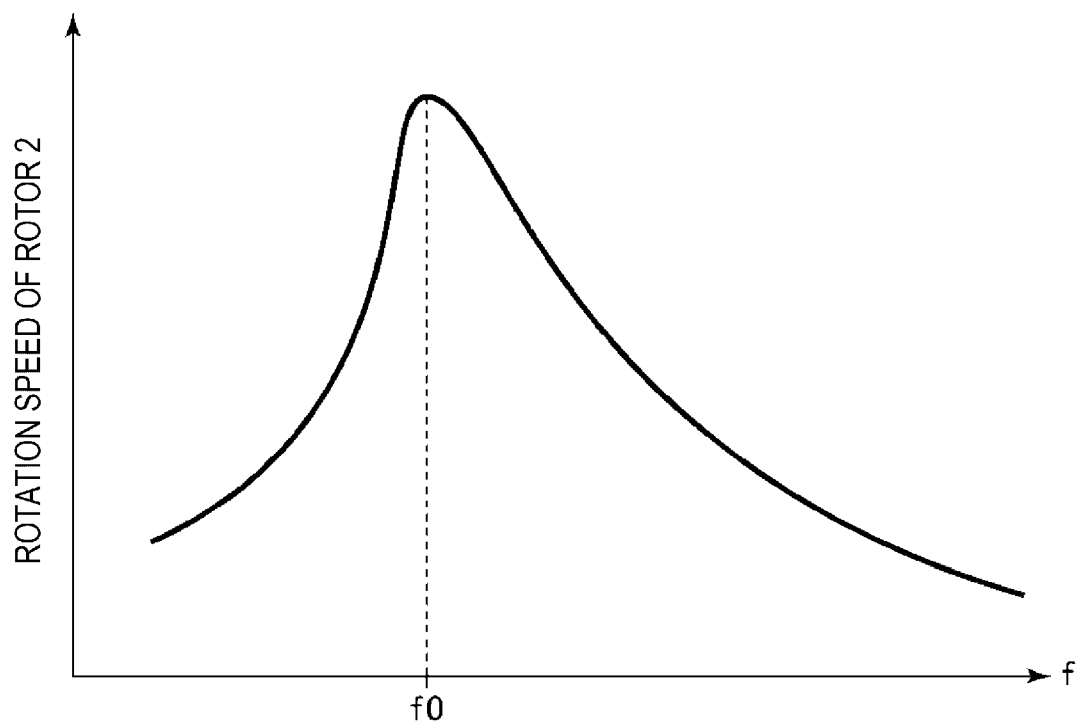
FIG. 6 shows a relationship between a frequency of the drive signal and a rotation speed of a rotor.
Figure 7:
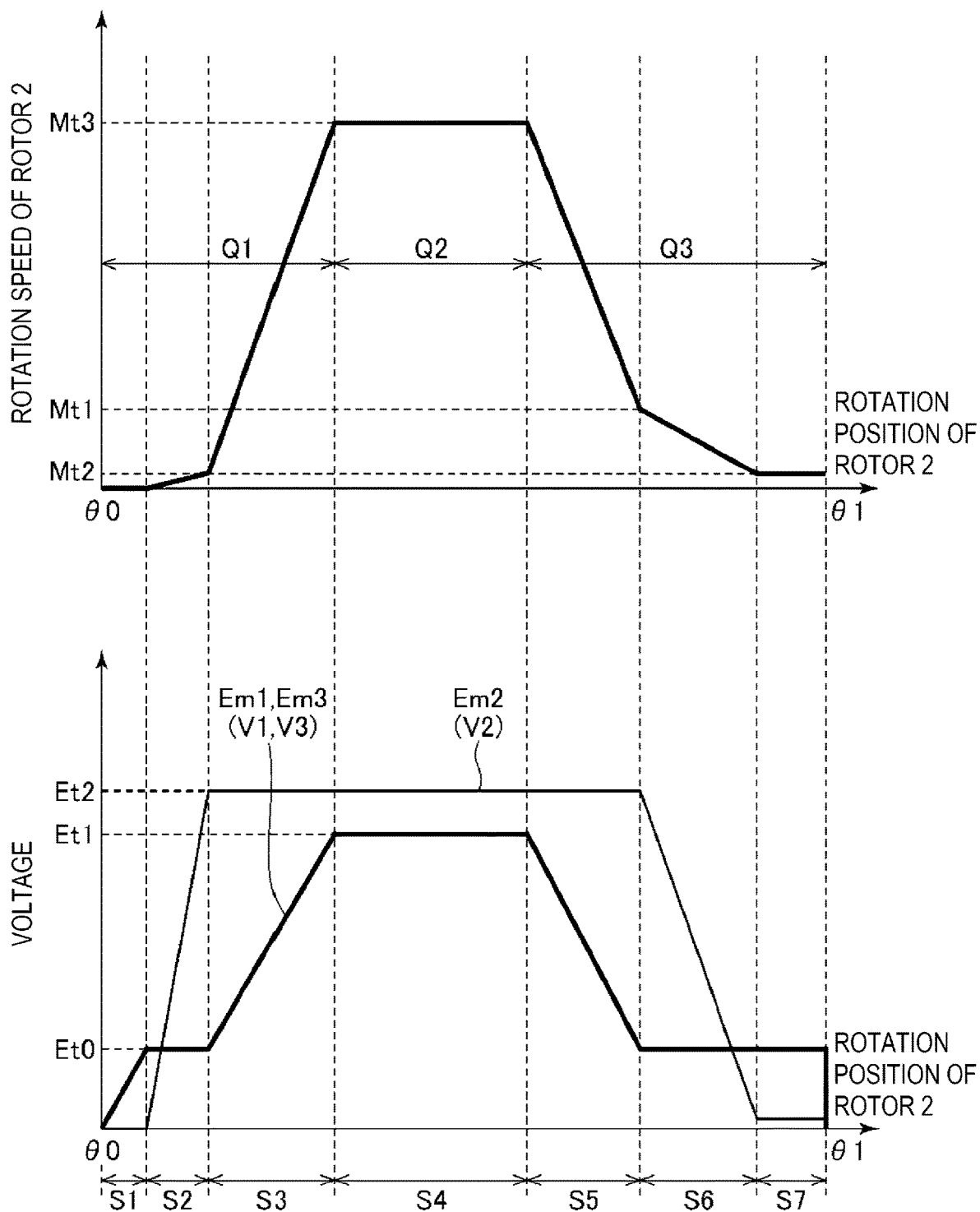
FIG. 7 shows a control method for a piezoelectric drive device.

FIG. 1 is a plan view showing a piezoelectric motor according to a first embodiment of the present disclosure. FIG. 2 is a plan view showing a piezoelectric actuator of the piezoelectric motor. FIG. 3 shows drive signals applied to the piezoelectric actuator. FIGS. 4 and 5 are plan views showing drive states of the piezoelectric actuator. FIG. 6 shows a relationship between a frequency of the drive signal and a rotation speed of a rotor. FIG. 7 shows a control method for a piezoelectric drive device.

Hereinafter, for convenience of explanation, the rotor side of the piezoelectric actuator is also referred to as "distal end side" and the opposite side to the rotor is also referred to as "proximal end side". Further, three axes orthogonal to one another are an X-axis, a Y-axis, and a Z-axis, and directions along the X-axis are also referred to as "X-axis directions", directions along the Y-axis are also referred to as "Y-axis directions", and directions along the Z-axis are also referred to as "Z-axis directions". Furthermore, the arrow-head sides of the respective axes are also referred to as "plus sides", and the opposite sides to the arrow-heads are also referred to as "minus sides".

As shown in FIG. 1, a piezoelectric motor 1 has a rotor 2 as a driven member rotatable around a rotation axis O, a piezoelectric drive device 3 in contact with an outer circumferential surface 21 of the rotor 2, an encoder 9 detecting a rotation amount of the rotor 2, and a controller 7 controlling driving of the piezoelectric drive device 3. In the piezoelectric motor 1, the piezoelectric drive device 3 drives under control by the controller 7, drive power generated in the piezoelectric drive device 3 is transmitted to the rotor 2, and the rotor 2 rotates around the rotation axis O. Note that the configuration of the piezoelectric motor 1 is not particularly limited. For example, a plurality of the piezoelectric drive devices 3 may be placed along the circumferential direction of the rotor 2 and the rotor 2 may be rotated by driving of the plurality of piezoelectric drive devices 3. Alternatively, the piezoelectric drive device 3 may be in contact with a principal surface 22, not the outer circumferential surface 21 of the rotor 2. Alternatively, the driven member is not limited to a rotating body like the rotor 2, but may be e.g. a slider that linearly moves.

The encoder 9 is not particularly limited to, but includes an incremental encoder that detects the rotation amount when the rotor 2 rotates or an absolute encoder that detects an absolute position from the origin of the rotor 2 regardless of whether the rotor 2 rotates or not. The encoder 9 has a scale 91 placed on the principal surface 22 of the rotor 2 and an optical element 92 placed to face the scale 91. A pattern (not shown) is provided on the scale 91. On the other hand, the optical element 92 has a light emitting device 921 that radiates light toward the pattern of the scale 91 and a light receiving device 922 that receives the light reflected by the scale 91. The encoder 9 may detect the rotation amount, a drive speed, an absolute position, etc. of the rotor 2 based on the light reception result of the light receiving device 922. Note that the configuration of the encoder 9 is not particularly limited as long as the configuration may exert the functions thereof. For example, the encoder 9 may have a configuration that detects the rotation amount, the drive speed, the absolute position, etc. of the rotor 2 by template matching using an imaging device.

The piezoelectric drive device 3 has a piezoelectric actuator 4 and an urging member 5 that urges the piezoelectric actuator 4 toward the rotor 2. As shown in FIG. 2, the piezoelectric actuator 4 has a vibrating portion 41, a supporting portion 42 supporting the vibrating portion 41, coupling portions 43 coupling the vibrating portion 41 and the supporting portion 42, and a convex portion 44 as a transmitting portion placed in the distal end part of the vibrating portion 41 and transmitting vibration of the vibrating portion 41 to the rotor 2.

The vibrating portion 41 has a plate-like shape having a thickness in the X-axis directions and spreading on the YZ-plane containing the Y-axis and the Z-axis. Further, the vibrating portion 41 has an elongated shape elongated in the Y-axis directions, particularly, a rectangular shape in the embodiment. Note that the shape of the vibrating portion 41 is not particularly limited as long as the shape may exert the functions thereof. Further, the vibrating portion 41 has drive piezoelectric elements 4A to 4F and a detection piezoelectric element 4G that detects vibration of the vibrating portion 41. In the center part of the vibrating portion 41, the piezoelectric elements 4C, 4D are arranged side by side in the Y-axis directions. Further, the piezoelectric actuators 4A, 4B are arranged side by side in the Y-axis directions at the plus side in the Z-axis direction of the piezoelectric elements 4C, 4D, and the piezoelectric actuators 4E, 4F are arranged side by side in the Y-axis directions at the minus side in the Z-axis direction. These piezoelectric elements 4A to 4F respectively expand and contract in the Y-axis directions by energization. Note that the number and the placement of the drive piezoelectric elements are not particularly limited as long as the elements may excite desired vibration in the vibrating portion 41.

The detection piezoelectric element 4G is placed between the piezoelectric elements 4C, 4D. The piezoelectric element 4G receives an external force according to the vibration of the vibrating portion 41 and outputs a detection signal according to the received external force. Accordingly, the piezoelectric drive device 3 may sense the vibration state of the vibrating portion 41 based on the detection signal output from the piezoelectric element 4G. Note that the number and the placement of the detection piezoelectric element are not particularly limited as long as the element may detect the vibration of the vibrating portion 41. Alternatively, the detection piezoelectric element may be omitted.

These piezoelectric elements 4A to 4F have configurations with piezoelectric materials sandwiched by pairs of electrodes. The constituent material of the piezoelectric material is not particularly limited, but piezoelectric ceramics including e.g. lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate may be used. Further, as the piezoelectric material, not only the above described piezoelectric ceramics but also polyvinylidene fluoride, quartz crystal, or the like may be used. The method of forming the piezoelectric material is not particularly limited, but the material may be formed from a bulk material or using the sol-gel method or the sputtering method. In the embodiment, the piezoelectric material is formed using the sol-gel method. Thereby, for example, the thinner piezoelectric material is obtained than that when the piezoelectric material is formed from a bulk material, and the thickness of the piezoelectric actuator 4 may be reduced.

The convex portion 44 is provided in the distal end part of the vibrating portion 41 and projects from the vibrating portion 41 toward the plus side in the Y-axis direction. The distal end part of the convex portion 44 is in contact with the outer circumferential surface 21 of the rotor 2 and pressed by the urging member 5. Accordingly, the vibration of the vibrating portion 41 is transmitted to the rotor 2 via the convex portion 44. The supporting portion 42 supports the vibrating portion 41. The supporting portion 42 has a U-shape surrounding both sides and the distal end side of the vibrating portion 41 in a plan view. Further, the coupling portions 43 couple a part as a node of the flexural vibration of the vibrating portion 41, specifically, the center part in the Y-axis directions and the supporting portion 42. Note that the configurations of the supporting portion 42 and the coupling portions 43 are not respectively particularly limited as long as the portions may exert the functions thereof.

The urging member 5 has a function of urging the piezoelectric actuator 4 toward the rotor 2 and pressing the convex portion 44 against the outer circumferential surface 21 of the rotor 2. As shown in FIG. 1, the urging member 5 has a holding portion 51 holding the supporting portion 42 of the piezoelectric actuator 4, a base 52 fixing the piezoelectric drive device 3 to a stage ST, and a pair of spring groups 53, 54 coupling the holding portion 51 and the base 52. The urging member 5 urges the piezoelectric actuator 4 toward the rotor 2 using restoring forces of the spring groups 53, 54. Note that the configuration of the urging member 5 is not particularly limited as long as the member may urge the piezoelectric actuator 4 toward the rotor 2.

The controller 7 include e.g. a computer and has a processor that processes information, a memory communicably coupled to the processor, and an external interface. Further, a program that can be executed by the processor is stored in the memory and the processor reads and executes the program stored in the memory. The controller 7 receives a command from a host computer (not shown) and drives the piezoelectric actuator 4 based on the command.

For example, when a drive signal V1 shown in FIG. 3 is applied to the piezoelectric elements 4A, 4F, a drive signal V2 is applied to the piezoelectric elements 4C, 4D, and a drive signal V3 is applied to the piezoelectric elements 4B, 4E, as shown in FIG. 4, the vibrating portion 41 stretchingly vibrates in the Y-axis directions and flexurally vibrates in the Z-axis directions, these vibrations are synthesized, and the distal end of the convex portion 44 makes elliptic motion tracing an elliptic trajectory counterclockwise as shown by an arrow A1. Then, the rotor 2 is turned around by the elliptic motion of the convex portion 44, and the rotor 2 rotates clockwise as shown by an arrow B1. When the waveforms of the drive signals V1, V3 are switched, as shown in FIG. 5, the vibrating portion 41 stretchingly vibrates in the Y-axis directions and flexurally vibrates in the Z-axis directions, these vibrations are synthesized, and the distal end of the convex portion 44 makes elliptic motion tracing an elliptic trajectory clockwise as shown by an arrow A2. Then, the rotor 2 is turned around by the elliptic motion of the convex portion 44, and the rotor 2 rotates counterclockwise as shown by an arrow B2. Note that the above described "elliptic motion" includes not only the motion having the trajectory coinciding with an ellipse but also motion having a trajectory slightly shifted from the ellipse e.g. a circle or oval. Em1, Em2, Em3 shown in FIG. 3 are the maximum voltage values of the drive signals V1, V2, V3, respectively, and referred to as "voltage values" hereinafter.

As below, the stretching vibration of the vibrating portion 41 in the Y-axis directions is also referred to as "longitudinal vibration". The longitudinal vibration is excited by application of the drive signal V2 to the piezoelectric elements 4C, 4D, and the flexural vibration is excited by application of the drive signals V1, V3 to the piezoelectric elements 4A, 4B, 4E, 4F. That is, the longitudinal vibration is controlled by the drive signal V2 and the flexural vibration is controlled by the drive signals V1, V3.

Here, the vibrating portion 41 is designed so that the resonance frequencies of the longitudinal vibration and the flexural vibration may be substantially equal. Hereinafter, the resonance frequency of the longitudinal vibration and the flexural vibration is set to f0. The frequency f of the drive signals V1, V2, V3 is not particularly limited, but preferably higher than the resonance frequency f0. As below, the reason for that will be briefly explained. FIG. 6 shows a relationship between the frequency f and a rotation speed, i.e., a movement speed of the rotor 2. As shown in the drawing, the rotation speed of the rotor 2 is the maximum when the frequency f coincides with the resonance frequency f0 and the rotation speed of the rotor 2 is lower as the frequency f is farther from the resonance frequency f0. With a peak at the resonance frequency f0, the rotation speed of the rotor 2 decreases relatively gently at the higher frequency side than the resonance frequency f0, and the rotation speed of the rotor 2 steeply decreases at the lower frequency side than the resonance frequency f0 in comparison with that at the higher frequency side. Accordingly, the frequency f is set to be higher than the resonance frequency f0, and thereby, the degree of the change of the drive speed of the rotor 2 relative to the change of the frequency f may be made smaller and the rotation speed of the rotor 2 may be easily controlled. Note that the frequency f may be equal to the resonance frequency f0 or lower than the resonance frequency f0.

In a control method for the piezoelectric actuator 4, the amplitude of the longitudinal vibration is changed with the amplitude of the flexural vibration kept constant, and the movement amount, i.e., the rotation speed of the rotor 2 is controlled. Note that, as will be understood from the following explanation, "with the amplitude of the flexural vibration kept constant" refers to a state in which the voltage values Em1, Em3 and the frequency f of the drive signals V1, V3 for controlling the flexural vibration are kept constant, but not necessarily a state in which the real amplitude is constant. Similarly, as will be described later, "with the amplitude of the longitudinal vibration kept constant" refers to a state in which the voltage value Em2 and the frequency f of the drive signal V2 for controlling the longitudinal vibration are kept constant, but not necessarily a state in which the real amplitude is constant. In the following specific explanation, in the embodiment, it is assumed that the frequency f of the drive signals V1, V2, V3 is kept constant during operation of the piezoelectric actuator 4. The above described "constant" includes e.g. a case including microscopic variations that may be generated in the configuration of the circuit or the like in addition to a case without variations over time.

For example, as shown in FIG. 4, in the middle of the rotation of the rotor 2 in the arrow B1 direction, when the voltage value Em2 of the drive signal V2 is increased without changes of the drive signals V1, V3, the amplitude of the longitudinal vibration increases with the amplitude of the flexural vibration kept. As the amplitude of the longitudinal vibration is larger, the elliptic motion of the convex portion 44 is larger and the rotation speed of the rotor 2 in the arrow B1 direction is higher. On the other hand, when the voltage value Em2 of the drive signal V2 is decreased without changes of the drive signals V1, V3, the amplitude of the longitudinal vibration decreases with the amplitude of the flexural vibration kept. As the amplitude of the longitudinal vibration is smaller, the elliptic motion of the convex portion 44 is smaller and the rotation speed of the rotor 2 in the arrow B1 direction is lower. In this manner, the parameter to be changed is limited to the amplitude of the longitudinal vibration, and thereby, driving of the piezoelectric actuator 4 becomes stable and the rotation speed of the rotor 2 is easily controlled. Particularly, with the microscopic longitudinal vibration, as the time when the convex portion 44 is apart from the outer circumferential surface 21 of the rotor 2 is made shorter relative to the time in contact, the rotor 2 may be stably rotated at a low speed and the movement of the rotor 2 may be microscopically controlled.

Next, as shown in FIG. 7, an example in which the rotor 2 is rotationally moved from a rotation position θ0 to a rotation position θ1 will be representatively explained by application of the above described control method. In the rotational movement from the rotation position θ0 to the rotation position θ1, there are an acceleration area Q1 where the rotor 2 is accelerated from a stop state to a target maximum speed Mt3, a constant-speed area Q2 where the rotor 2 is kept at the target maximum speed Mt3, and a deceleration area Q3 where the rotor 2 is decelerated from the target maximum speed Mt3 to the stop state.

Acceleration Area Q1

First, as step S1, the controller 7 applies the drive signals V1, V3 at a target voltage value Et0 to the piezoelectric actuator 4. In this condition, the convex portion 44 is pressed against the rotor 2 by the urging member 5, and the flexural deformation of the vibrating portion 41 is not allowed and the flexural vibration is not generated in the vibrating portion 41. That is, in a case of an automobile, this state is equal to a state in which the start of the automobile is blocked with a brake strongly pressed while an accelerator is pressed. The target voltage value Et0 is set to be low so that the flexural vibration may not be generated over a friction force between the convex portion 44 and the rotor 2. Note that, in FIG. 7, the voltage values Em1, Em3 are gradually increased to be the target voltage value Et0, however, the voltage values Em1, Em3 at the target voltage value Et0 may be initially applied.

Then, as step S2, the controller 7 applies the drive signal V2 to the piezoelectric actuator 4 with the amplitude of the flexural vibration kept constant by keeping the voltage values Em1, Em3 constant. Thereby, the longitudinal vibration is generated in the vibrating portion 41. Further, the convex portion 44 is separated from the rotor 2 by the longitudinal vibration and the flexural vibration suppressed at step S1 is generated, these vibrations are synthesized, and the convex portion 44 makes elliptic motion. As a result, the rotor 2 rotates around the arrow B1.

Here, at this step, the controller 7 gradually increases the voltage value Em2 of the drive signal V2 to a target voltage value Et2 to gradually increase the amplitude of the longitudinal vibration. Thereby, the amplitude of the longitudinal vibration gradually increases, the elliptic motion of the convex portion 44 gradually increases with the increase, and the rotation speed of the rotor 2 gradually increases. Accordingly, a sudden start of the rotor 2 is suppressed and the start of rotation of the rotor 2 becomes smoother. Further, only the amplitude of the longitudinal vibration is changed, and thereby, compared to a case where both the amplitude of the flexural vibration and the amplitude of the longitudinal vibration are changed, the vibration state of the piezoelectric actuator 4 changes more stably. Accordingly, the rotation amount and the rotation speed of the rotor 2 may be accurately controlled.

The rotation of the rotor 2 is started by the start of the longitudinal vibration, and thereby, the state at step S1 is stabilized. It is difficult to accurately make the longitudinal vibration in the Y-axis directions, and the longitudinal vibration may be slightly tilted relative to the Y-axis directions. When the longitudinal vibration is tilted relative to the Y-axis directions, a force component for rotating the rotor 2 is mixed in the longitudinal vibration and the rotor 2 may rotated only by the longitudinal vibration. Accordingly, the longitudinal vibration is not started at step S1, but the longitudinal vibration is started at step S2, and thereby, unintended rotation of the rotor 2 generated at step S1 may be effectively suppressed.

Then, as step S3, the controller 7 gradually increases the voltage values Em1, Em3 of the drive signals V1, V3 to a target voltage value Et1 with the amplitude of the longitudinal vibration kept constant by keeping the voltage value Em2 constant. Thereby, the amplitude of the flexural vibration gradually increases and the rotation speed of the rotor 2 increases with the increase. In this manner, only the amplitude of the flexural vibration is changed, and thereby, compared to a case where both the amplitude of the flexural vibration and the amplitude of the longitudinal vibration are changed, the vibration state of the piezoelectric actuator 4 changes more stably and the rotation amount and the rotation speed of the rotor 2 may be controlled more accurately. Further, compared to a case where the amplitude of the longitudinal vibration is gradually increased with the amplitude of the flexural vibration kept constant like the previous step S2, the rotation speed of the rotor 2 may be easily increased more sharply.

Constant-Speed Area Q2

Then, as step S4, the controller 7 keeps the voltage values Em1, Em2, Em3 at the target voltage values Et1, Et2 and keeps the rotation speed of the rotor 2 at the target maximum speed Mt3.

Deceleration Area Q3

Then, as step S5, the controller 7 gradually decreases the voltage values Em1, Em3 of the drive signals V1, V3 with the amplitude of the longitudinal vibration kept constant by keeping the voltage value Em2 of the drive signal V2 constant. That is, the amplitude of the flexural vibration is gradually decreased. Thereby, the rotation speed of the rotor 2 decreases. In this manner, only the amplitude of the flexural vibration is changed, and thereby, compared to a case where both the amplitude of the flexural vibration and the amplitude of the longitudinal vibration are changed, the vibration state of the piezoelectric actuator 4 changes more stably and the rotation amount and the rotation speed of the rotor 2 may be controlled more accurately. Further, compared to a case where the amplitude of the longitudinal vibration is gradually decreased with the amplitude of the flexural vibration kept constant like the next step S6, the rotation speed of the rotor 2 may be easily decreased more sharply. The controller 7 continues this step until the rotation speed of the rotor 2 reaches a target rotation speed Mt1.

When the rotation speed of the rotor 2 reaches the target rotation speed Mt1, as step S6, the controller 7 gradually decreases the voltage value Em2 of the drive signal V2 with the amplitude of the flexural vibration kept constant by keeping the voltage values Em1, Em3 of the drive signals V1, V3 constant. That is, the amplitude of the longitudinal vibration is gradually decreased. Thereby, the rotation speed of the rotor 2 further decreases. In this manner, only the amplitude of the longitudinal vibration is changed, and thereby, compared to a case where both the amplitude of the flexural vibration and the amplitude of the longitudinal vibration are changed, the vibration state of the piezoelectric actuator 4 changes more stably and the rotation amount and the rotation speed of the rotor 2 may be controlled more accurately. Particularly, with the microscopic longitudinal vibration, the time when the convex portion 44 is apart from the outer circumferential surface 21 of the rotor 2 is made shorter relative to the time in contact, and the rotor 2 may be stably rotated at a low speed and the movement of the rotor 2 may be easily microscopically controlled. The controller 7 continues this step until the rotation speed of the rotor 2 reaches a target rotation speed Mt2.

When the rotation speed of the rotor 2 reaches the target rotation speed Mt2, as step S7, the controller 7 keeps the rotation speed of the rotor 2 at the target rotation speed Mt2 by keeping the voltage values Em1, Em2, Em3 of the drive signals V1, V2, V3 constant. The target rotation speed Mt2 is set to be a sufficiently low speed. Thereby, the rotor 2 may be stably rotated at the sufficiently low speed. Then, the controller 7 stops the application of the drive signals V1, V2, V3 to the piezoelectric actuator 4 when the rotor 2 is in the rotation position θ1. According to the method, the rotor 2 is stably rotated at the sufficiently low speed immediately before being stopped, and thereby, a shift of the stop position relative to the rotation position θ1 may be suppressed to be smaller. Accordingly, advanced position control can be performed and redriving for changing the stop position or the like is not necessary. Therefore, for example, when the actuator is applied to a robot 1000, which will be described later, the cycle time of robot work may be shortened.

As above, the piezoelectric motor 1 is explained. The control method for the piezoelectric drive device 3 applied to the piezoelectric motor 1 is the control method for the piezoelectric drive device 3 having the vibrating portion 41 including the piezoelectric elements 4A to 4F and the convex portion 44 as the transmitting portion, synthesizing the longitudinal vibration and the flexural vibration by energization to the piezoelectric elements 4A to 4F to vibrate the vibrating portion 41 and make elliptic motion of the convex portion 44, and moving the rotor 2 as the driven member by the elliptic motion of the convex portion 44, controlling the movement amount of the rotor 2 by changing the amplitude of the longitudinal vibration with the amplitude of the flexural vibration kept constant. In this manner, the parameter to be changed is limited to the amplitude of the longitudinal vibration, and thereby, compared to a case where both the amplitude of the flexural vibration and the amplitude of the longitudinal vibration are changed, the vibration state of the piezoelectric actuator 4 changes more stably and the rotation amount of the rotor 2 is easily controlled. Particularly, with the microscopic longitudinal vibration, as the time when the convex portion 44 is apart from the outer circumferential surface 21 of the rotor 2 is made shorter relative to the time in contact, the rotor 2 may be stably rotated at a lower speed and the movement of the rotor 2 may be microscopically controlled.

As described above, in the control method for the piezoelectric drive device 3, the amplitude of the longitudinal vibration is gradually increased with the amplitude of the flexural vibration kept constant and the movement of the stopped rotor 2 is started (step S2). Thereby, a sudden start of the rotor 2 is suppressed and the start of rotation of the rotor 2 becomes smoother. Accordingly, the rotational movement of the rotor 2 may be accurately controlled.

As described above, in the control method for the piezoelectric drive device 3, after the rotor 2 starts to move, the amplitude of the flexural vibration is gradually increased with the amplitude of the longitudinal vibration kept constant, and thereby, the rotation amount, i.e., the movement speed of the rotor 2 is increased (step S3). In this manner, only the amplitude of the flexural vibration is changed, and thereby, compared to a case where both the amplitude of the flexural vibration and the amplitude of the longitudinal vibration are changed, the vibration state of the piezoelectric actuator 4 changes more stably and the rotation speed of the rotor 2 may be controlled more accurately. Further, compared to a case where the amplitude of the longitudinal vibration is gradually increased with the amplitude of the flexural vibration kept constant like the previous step S2, the rotation speed of the rotor 2 may be easily increased more sharply.

As described above, in the control method for the piezoelectric drive device 3, the amplitude of the longitudinal vibration is gradually decreased with the amplitude of the flexural vibration kept constant, and thereby, the movement speed of the rotor 2 decreases (step S6). In this manner, only the amplitude of the longitudinal vibration is changed, and thereby, compared to a case where both the amplitude of the flexural vibration and the amplitude of the longitudinal vibration are changed, the vibration state of the piezoelectric actuator 4 changes more stably and the rotation speed of the rotor 2 may be controlled more accurately. Particularly, with the microscopic longitudinal vibration, as the time when the convex portion 44 is apart from the outer circumferential surface 21 of the rotor 2 is made shorter relative to the time in contact, the rotor 2 may be stably rotated at a lower speed and the movement of the rotor 2 may be microscopically controlled more easily.

As described above, in the control method for the piezoelectric drive device 3, prior to step S6 of decreasing the movement speed of the rotor 2 by gradually decreasing the amplitude of the longitudinal vibration, the amplitude of the flexural vibration is gradually decreased with the amplitude of the longitudinal vibration kept constant, and thereby, the movement speed of the rotor 2 may be decreased (step S5). In this manner, only the amplitude of the flexural vibration is changed, and thereby, compared to a case where both the amplitude of the flexural vibration and the amplitude of the longitudinal vibration are changed, the vibration state of the piezoelectric actuator 4 changes more stably and the rotation speed of the rotor 2 may be controlled more accurately. Further, compared to a case where the amplitude of the longitudinal vibration is gradually decreased with the amplitude of the flexural vibration kept constant like step S6, the rotation speed of the rotor 2 may be easily decreased more sharply.

As described above, in the control method for the piezoelectric drive device 3, the amplitude of the longitudinal vibration is controlled by the voltage value Em2 of the drive signal V2 applied to the piezoelectric elements 4C, 4D. Thereby, the amplitude of the longitudinal vibration may be easily controlled.

Second Embodiment

Figure 8:
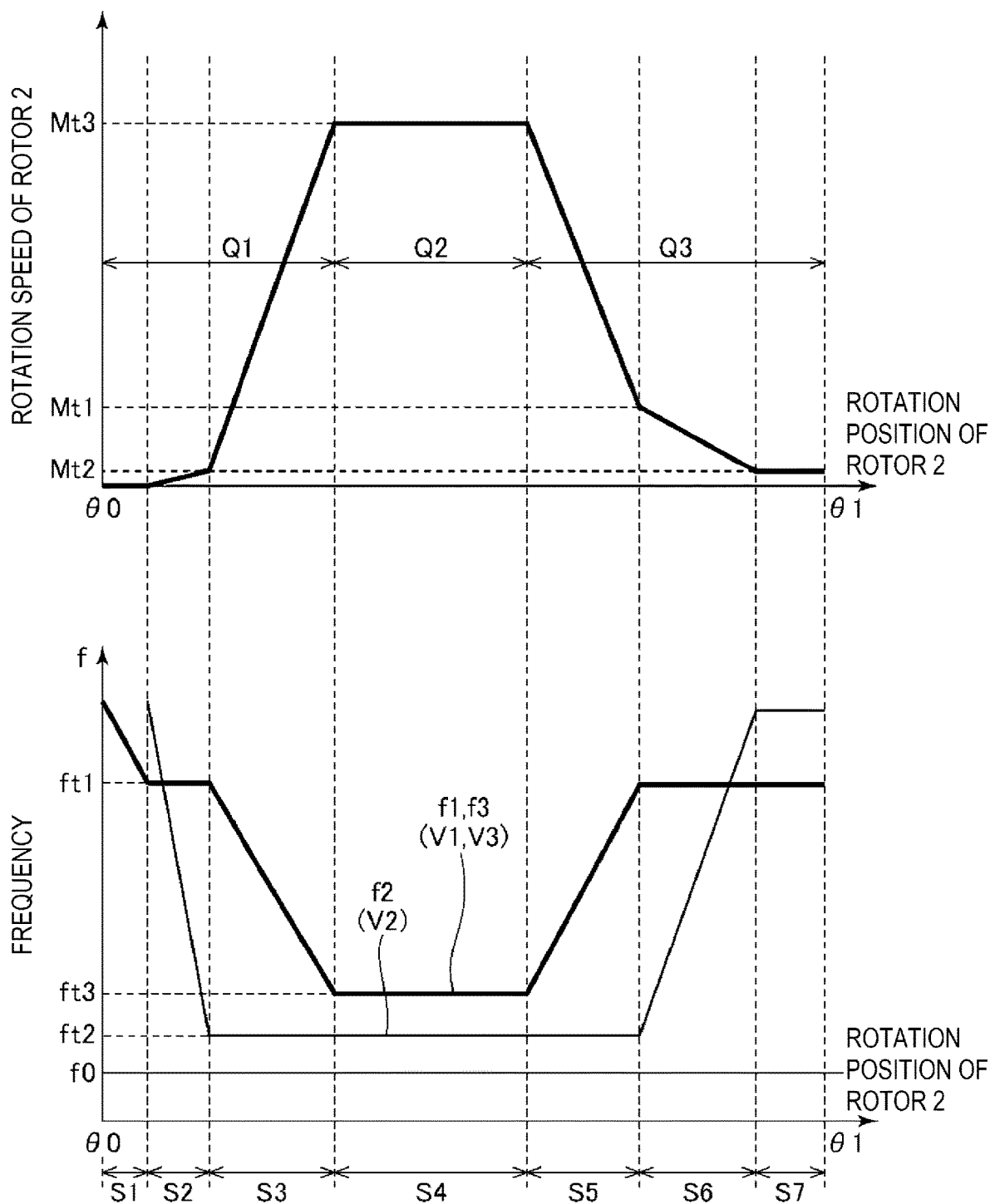
FIG. 8 shows a control method for a piezoelectric drive device according to a second embodiment.

FIG. 8 shows a control method for a piezoelectric drive device according to a second embodiment.

This embodiment is the same as the above described first embodiment except that the amplitude of the flexural vibration and the amplitude of the longitudinal vibration are controlled by the frequency f, not by the voltage values Em1, Em2, Em3 of the drive signals V1, V2, V3. In the following description, the embodiment will be explained with a focus on the differences from the above described embodiment and the explanation of the same items will be omitted. In FIG. 8, the same configurations as those of the above described embodiment have the same signs.

As below, the control method for the piezoelectric drive device 3 of the embodiment will be explained using an example in which the rotor 2 is rotationally moved from the rotation position θ0 to the rotation position θ1 at steps S1 to S7 like the above described first embodiment. Note that, hereinafter, the frequency f of the drive signal V1 is referred to as "frequency f1", the frequency f of the drive signal V2 is referred to as "frequency f2", and the frequency f of the drive signal V3 is referred to as "frequency f3". Further, the frequencies f1, f2, f3 are set to be higher than the resonance frequency f0. Furthermore, during the operation of the piezoelectric actuator 4, the voltage values Em1, Em2, Em3 of the drive signals V1, V2, V3 are kept constant. The above described "constant" includes e.g. a case including microscopic variations that may be generated in the configuration of the circuit or the like in addition to a case without variations.

Acceleration Area Q1

First, as step S1, the controller 7 applies the drive signals V1, V3 at a target frequency ft1 to the piezoelectric actuator 4. In this condition, the convex portion 44 is pressed against the rotor 2 by the urging member 5, and the flexural deformation of the vibrating portion 41 is not allowed and the flexural vibration is not generated in the vibrating portion 41. Note that, in FIG. 8, the frequencies f1, f3 are gradually decreased to be the target frequency ft1, however, the frequencies may be initially set to the target frequency ft1.

Then, as step S2, the controller 7 applies the drive signal V2 to the piezoelectric actuator 4 with the amplitude of the flexural vibration kept constant by keeping the frequencies f1, f3 constant. Thereby, the longitudinal vibration is generated in the vibrating portion 41. Further, the convex portion 44 is separated from the rotor 2 by the longitudinal vibration and the flexural vibration suppressed at step S1 is started, and these vibrations are synthesized and the convex portion 44 makes elliptic motion. As a result, the rotor 2 rotates around the arrow B1. Here, at this step, the controller 7 gradually decreases the frequency f2 of the drive signal V2 to a target frequency ft2 to gradually increase the amplitude of the longitudinal vibration. Thereby, the elliptic motion of the convex portion 44 gradually increases and the rotation speed of the rotor 2 gradually increases. Accordingly, a sudden start of the rotor 2 is suppressed, the start of rotation of the rotor 2 becomes smoother, and the rotation amount and the rotational movement of the rotor 2 may be accurately controlled.

Then, as step S3, the controller 7 gradually decreases the frequencies f1, f3 of the drive signals V1, V3 to a target frequency ft3 with the amplitude of the longitudinal vibration kept constant by keeping the frequency f2 constant. Thereby, the amplitude of the flexural vibration gradually increases and the rotation speed of the rotor 2 increases with the increase.

Constant-Speed Area Q2

Then, as step S4, the controller 7 keeps the frequencies f1, f2, f3 at the target frequencies ft2, ft3 and keeps the rotation speed of the rotor 2 at the target maximum speed Mt3.

Deceleration Area Q3

Then, as step S5, the controller 7 gradually increases the frequencies f1, f3 of the drive signals V1, V3 with the amplitude of the longitudinal vibration kept constant by keeping the frequency f2 of the drive signal V2 constant. That is, the amplitude of the flexural vibration is gradually decreased. Thereby, the rotation speed of the rotor 2 decreases. The controller 7 continues this step until the rotation speed of the rotor 2 reaches the target rotation speed Mt1.

When the rotation speed of the rotor 2 reaches the target rotation speed Mt1, as step S6, the controller 7 gradually increases the frequency f2 of the drive signal V2 with the amplitude of the flexural vibration kept constant by keeping the frequencies f1, f3 of the drive signals V1, V3 constant. That is, the amplitude of the longitudinal vibration is gradually decreased. Thereby, the rotation speed of the rotor 2 further decreases. The controller 7 continues this step until the rotation speed of the rotor 2 reaches the target rotation speed Mt2.

When the rotation speed of the rotor 2 reaches the target rotation speed Mt2, as step S7, the controller 7 keeps the rotation speed of the rotor 2 at the target rotation speed Mt2 by keeping the frequencies f1, f2, f3 of the drive signals V1, V2, V3 constant. Then, the controller 7 stops the application of the drive signals V1, V2, V3 to the piezoelectric actuator 4 when the rotor 2 is in the rotation position θ1.

As above, the control method for the piezoelectric drive device 3 of the embodiment is explained. In the control method for the piezoelectric drive device 3, as described above, the amplitude of the longitudinal vibration is controlled by the frequency f2 of the drive signal V2 applied to the piezoelectric elements 4C, 4D. Thereby, the amplitude of the longitudinal vibration is easily controlled.

According to the above described second embodiment, the same effects as those of the above described first embodiment may be exerted.

Third Embodiment

Figure 9:
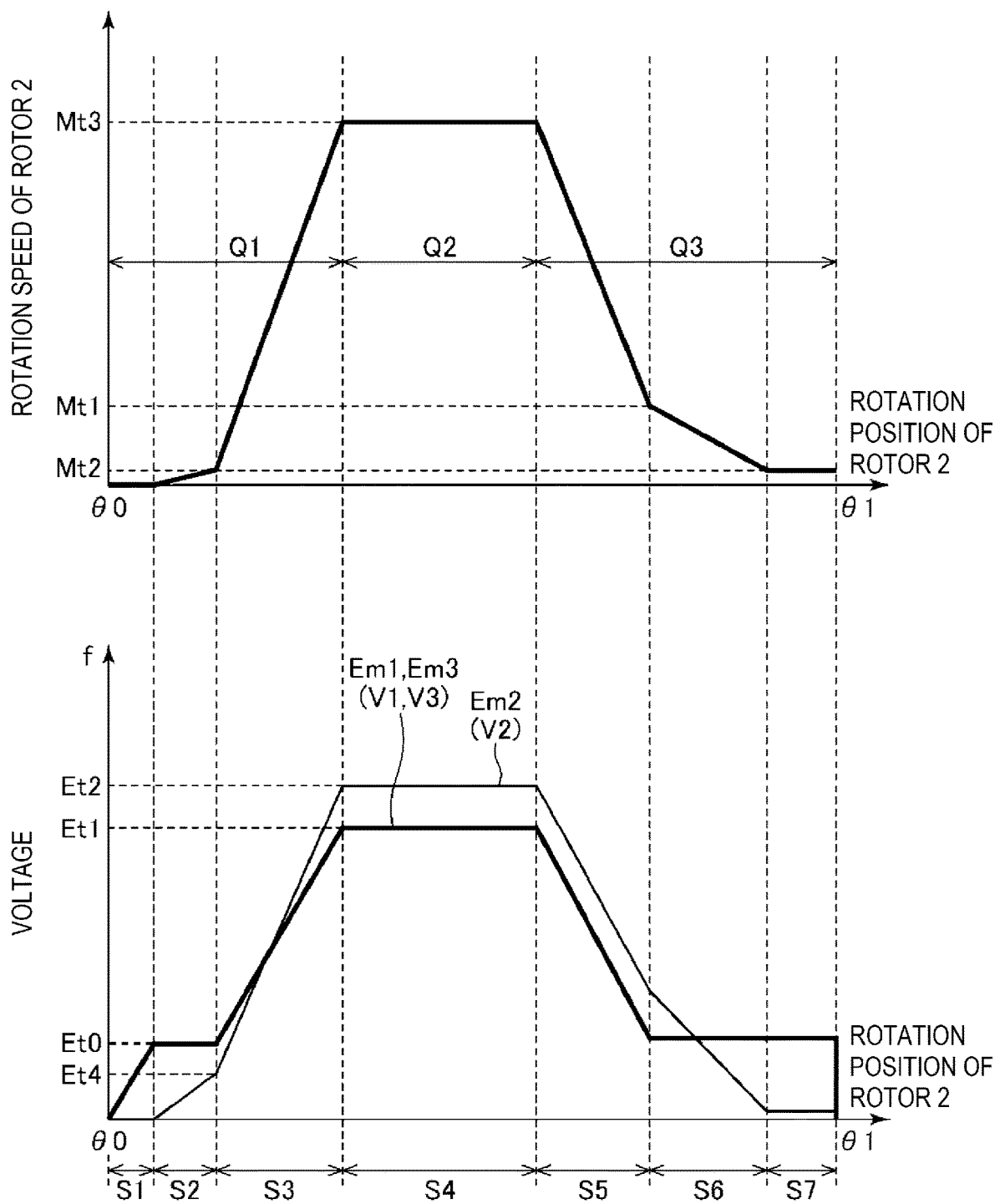
FIG. 9 shows a control method for a piezoelectric drive device according to a third embodiment.

FIG. 9 shows a control method for a piezoelectric drive device according to a third embodiment.

This embodiment is the same as the above described first embodiment except that steps S2, S3 and steps S5, S6 are different with respect to the control method for the piezoelectric drive device 3. In the following description, the embodiment will be explained with a focus on the differences from the above described embodiments and the explanation of the same items will be omitted. In FIG. 9, the same configurations as those of the above described embodiments have the same signs. As below, only steps S2, S3, S5, S6 will be explained with reference to FIG. 9.

Acceleration Area Q1

As step S2, the controller 7 gradually increases the voltage value Em2 of the drive signal V2 to a target voltage value Et4 to gradually increase the amplitude of the longitudinal vibration with the amplitude of the flexural vibration kept constant by keeping the voltage values Em1, Em3 constant. Thereby, the elliptic motion gradually increases and the rotation of the rotor 2 is started. Note that the target voltage value Et4 is set to be lower than the target voltage value Et2.

As step S3, the controller 7 gradually increases the voltage values Em1, Em3 of the drive signals V1, V3 to the target voltage value Et1 to gradually increase the amplitude of the flexural vibration and gradually increases the voltage value Em2 of the drive signal V2 to the target voltage value Et2 to gradually increase the amplitude of the longitudinal vibration. Thereby, the elliptic motion of the convex portion 44 gradually increases and the rotation speed of the rotor 2 increases with the increase. In this manner, both the amplitude of the flexural vibration and the amplitude of the longitudinal vibration are changed, and thereby, compared to a case where only one of the amplitude is changed, the rotation speed of the rotor 2 may be increased more sharply. Therefore, the constant-speed area Q2 becomes longer and the movement time from the rotation position θ0 to the rotation position θ1 may be shortened.

Deceleration Area Q3

Then, as step S5, the controller 7 gradually decreases the voltage values Em1, Em3 of the drive signals V1, V3 to gradually decrease the amplitude of the flexural vibration and gradually decreases the voltage value Em2 of the drive signal V2 to gradually decrease the amplitude of the longitudinal vibration. Thereby, the elliptic motion of the convex portion 44 gradually decreases and the rotation speed of the rotor 2 decreases with the decrease. In this manner, both the amplitude of the flexural vibration and the amplitude of the longitudinal vibration are changed, and thereby, compared to a case where only one of the amplitude is changed, the rotation speed of the rotor 2 may be decreased more sharply. Therefore, the constant-speed area Q2 becomes longer and the movement time from the rotation position θ0 to the rotation position θ1 may be shortened. The controller 7 continues this step until the rotation speed of the rotor 2 reaches the target rotation speed Mt1.

When the rotation speed of the rotor 2 reaches the target rotation speed Mt1, as step S6, the controller 7 gradually decreases the voltage value Em2 of the drive signal V2 with the amplitude of the flexural vibration kept constant by keeping the voltage values Em1, Em3 of the drive signals V1, V3 constant. Thereby, the rotation speed of the rotor 2 further decreases.

As above, the control method for the piezoelectric drive device 3 of the embodiment is explained. In the control method for the piezoelectric drive device 3, as described above, after the rotor 2 starts to move, the amplitude of the flexural vibration is gradually increased while the amplitude of the longitudinal vibration is gradually increased, and thereby, the movement speed of the rotor 2 is increased (step S3). In this manner, both the amplitude of the flexural vibration and the amplitude of the longitudinal vibration are changed, and thereby, compared to a case where only one of the amplitude is changed, the rotation speed of the rotor 2 may be increased more sharply. Therefore, the constant-speed area Q2 becomes longer and the movement time from the rotation position θ0 to the rotation position θ1 may be shortened.

In the control method for the piezoelectric drive device 3, as described above, the amplitude of the longitudinal vibration is gradually decreased while the amplitude of the flexural vibration is gradually decreased, and thereby, the movement speed of the rotor 2 is decreased (step S5). In this manner, both the amplitude of the flexural vibration and the amplitude of the longitudinal vibration are changed, and thereby, compared to a case where only one of the amplitude is changed, the rotation speed of the rotor 2 may be decreased more sharply. Therefore, the constant-speed area Q2 becomes longer and the movement time from the rotation position θ0 to the rotation position θ1 may be shortened.

According to the third embodiment, the same effects as those of the above described first embodiment may be exerted.

Fourth Embodiment

Figure 10:
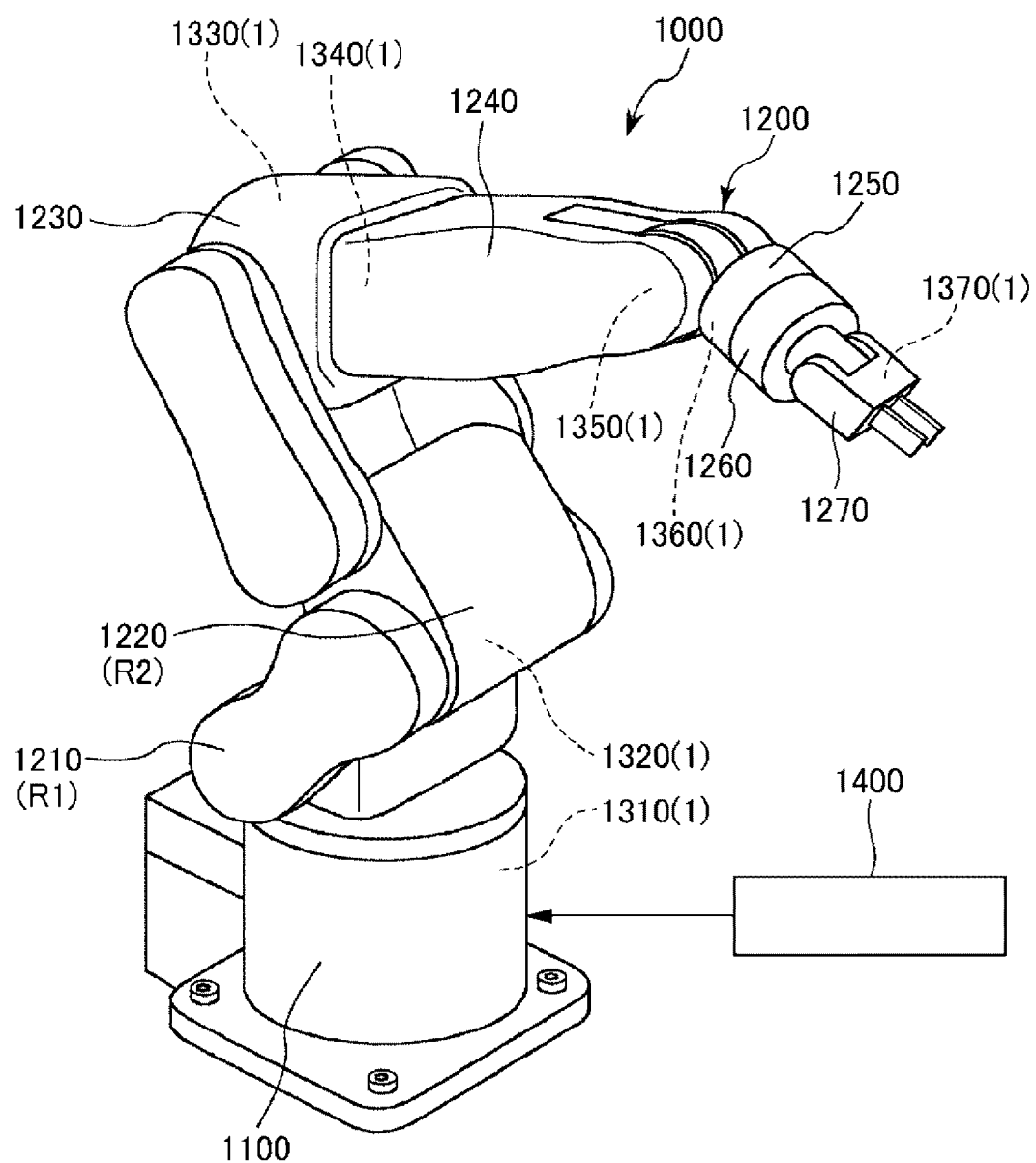
FIG. 10 is a perspective view showing a robot according to a fourth embodiment of the present disclosure.

FIG. 10 is a perspective view showing a robot according to a fourth embodiment of the present disclosure.

The robot 1000 shown in FIG. 10 may perform work of feeding, removing, transport, assembly, etc. of precision apparatuses and components forming the apparatuses. The robot 1000 is a six-axis articulated robot and has a base 1100 fixed to a floor or a ceiling and a manipulator 1200 supported by the base 1100.

The manipulator 1200 is a robotic arm having a plurality of mutually coupled arms and moving at a plurality of degrees of freedom, and has a first arm 1210 pivotably coupled to the base 1100, a second arm 1220 pivotably coupled to the first arm 1210, a third arm 1230 pivotably coupled to the second arm 1220, a fourth arm 1240 pivotably coupled to the third arm 1230, a fifth arm 1250 pivotably coupled to the fourth arm 1240, a sixth arm 1260 pivotably coupled to the fifth arm 1250, and an end effector 1270 attached to the sixth arm 1260.

One arbitrarily selected from these first to sixth arms 1210 to 1260 and the end effector 1270 may be referred to as "first member" and one arbitrarily selected except the first member may be referred to as "second member". Alternatively, for example, when there are a plurality of relatively movable members e.g. a pair of claws for gripping a workpiece within the end effector 1270, one claw may be referred to as "first member" and the other claw may be referred to as "second member". In the illustrated configuration, the first arm 1210 is referred to as "first member R1" and the second arm 1220 is referred to as "second member R2".

The robot 1000 has a first arm pivot mechanism 1310 placed in the joint between the base 1100 and the first arm 1210 and pivoting the first arm 1210 relative to the base 1100, a second arm pivot mechanism 1320 placed in the joint between the first arm 1210 and the second arm 1220 and pivoting the second arm 1220 relative to the first arm 1210, a third arm pivot mechanism 1330 placed in the joint between the second arm 1220 and the third arm 1230 and pivoting the third arm 1230 relative to the second arm 1220, a fourth arm pivot mechanism 1340 placed in the joint between the third arm 1230 and the fourth arm 1240 and pivoting the fourth arm 1240 relative to the third arm 1230, a fifth arm pivot mechanism 1350 placed in the joint between the fourth arm 1240 and the fifth arm 1250 and pivoting the fifth arm 1250 relative to the fourth arm 1240, a sixth arm pivot mechanism 1360 placed in the joint between the fifth arm 1250 and the sixth arm 1260 and pivoting the sixth arm 1260 relative to the fifth arm 1250, and an end effector drive mechanism 1370 driving the end effector 1270. Further, the robot 1000 has a robot control unit 1400 controlling driving of these first to sixth arm pivot mechanisms 1310 to 1360 and the end effector drive mechanism 1370.

The piezoelectric motor 1 is mounted in part or all of the first to sixth arm pivot mechanisms 1310 to 1360 and the end effector drive mechanism 1370 as a drive source and the first to sixth arms 1210 to 1260 and the end effector 1270 to be driven are driven by driving of the piezoelectric motor 1. The above described control method for the piezoelectric drive device 3 is applied to the control of the piezoelectric motor 1. Therefore, the robot 1000 may enjoy the effects by the above described control method for the piezoelectric drive device 3 and exert higher reliability.

As described above, a control method for the manipulator 1200 applied to the robot 1000 is a control method for the manipulator 1200 having the vibrating portion 41 including the piezoelectric elements 4A to 4F and the convex portion 44, synthesizing the longitudinal vibration and the flexural vibration by energization to the piezoelectric elements 4A to 4F to vibrate the vibrating portion 41 and make elliptic motion of the convex portion 44, and relatively moving the first member R1 and the second member R2 mutually coupled by the elliptic motion of the convex portion 44, controlling a relative movement amount of the first member R1 and the second member R2 by changing the amplitude of the longitudinal vibration with the amplitude of the flexural vibration kept constant. In this manner, the parameter to be changed is limited to the amplitude of the longitudinal vibration, and thereby, compared to a case where both the amplitude of the flexural vibration and the amplitude of the longitudinal vibration are controlled, the vibration state of the piezoelectric actuator 4 changes more stably and the rotation amount of the rotor 2 is easily controlled. Particularly, with the microscopic longitudinal vibration, as the time when the convex portion 44 is apart from the outer circumferential surface 21 of the rotor 2 is made shorter relative to the time in contact, the rotor 2 may be stably rotated at a lower speed and the driving of the manipulator 1200 may be microscopically controlled.

According to the fourth embodiment, the same effects as those of the above described first embodiment may be exerted.

As above, the control method for the piezoelectric drive device and the control method for the manipulator are explained based on the illustrated embodiments, however, the present disclosure is not limited to that. The configurations of the respective parts may be replaced by arbitrary configurations having the same functions. Further, an arbitrary configuration may be added to the present disclosure. Furthermore, the respective embodiments may be appropriately combined. Particularly, both the voltage values and the frequencies of the first, second, third drive signals are changed, and thereby, the amplitude of the longitudinal vibration and the flexural vibration may be controlled. In the above described embodiments, the configuration in which the piezoelectric drive device is applied to the robot is explained, however, the piezoelectric drive device may be applied not only to the robot but also to various electronic devices requiring drive power e.g. a printer, a projector, or the like.

What is claimed is:

1. A control method for a piezoelectric drive device including a vibrating portion having a piezoelectric element and a transmitting portion, synthesizing a longitudinal vibration and a flexural vibration by an energization to the piezoelectric element to vibrate the vibrating portion and make an elliptic motion of the transmitting portion, and moving a driven member by the elliptic motion, the control method comprising controlling a movement amount of the driven member by changing an amplitude of the longitudinal vibration with an amplitude of the flexural vibration kept constant.

2. The control method for the piezoelectric drive device according to claim 1, wherein
the amplitude of the longitudinal vibration is gradually increased with the amplitude of the flexural vibration kept constant, and thereby, movement of the driven member in a stop state is started.

3. The control method for the piezoelectric drive device according to claim 2, wherein
after the driven member starts to move, the amplitude of the flexural vibration is gradually increased with the amplitude of the longitudinal vibration kept constant, and thereby, a movement speed of the driven member is increased.

4. The control method for the piezoelectric drive device according to claim 2, wherein
after the driven member starts to move, the amplitude of the flexural vibration is gradually increased while the amplitude of the longitudinal vibration is gradually increased, and thereby, a movement speed of the driven member is increased.

5. The control method for the piezoelectric drive device according to claim 1, wherein
the amplitude of the longitudinal vibration is gradually decreased with the amplitude of the flexural vibration kept constant, and thereby, a movement speed of the driven member is decreased.

6. The control method for the piezoelectric drive device according to claim 1, wherein
the amplitude of the longitudinal vibration is gradually decreased while the amplitude of the flexural vibration is gradually decreased, and thereby, a movement speed of the driven member is decreased.

7. The control method for the piezoelectric drive device according to claim 5, wherein
prior to decreasing of the movement speed of the driven member by gradually decreasing of the amplitude of the longitudinal vibration, the amplitude of the flexural vibration is gradually decreased with the amplitude of the longitudinal vibration kept constant, and thereby, the movement speed of the driven member is decreased.

8. The control method for the piezoelectric drive device according to claim 1, wherein
the amplitude of the longitudinal vibration is controlled by a voltage value of a drive signal applied to the piezoelectric element.

9. The control method for the piezoelectric drive device according to claim 1, wherein
the amplitude of the longitudinal vibration is controlled by a frequency of a drive signal applied to the piezoelectric element.

10. A control method for a manipulator having a vibrating portion including a piezoelectric element and a transmitting portion, synthesizing a longitudinal vibration and a flexural vibration by an energization to the piezoelectric element to vibrate the vibrating portion and make an elliptic motion of the transmitting portion, and relatively moving a first member and a second member mutually coupled by the elliptic motion, the control method comprising controlling a relative movement amount of the first member and the second member by changing an amplitude of the longitudinal vibration with an amplitude of the flexural vibration kept constant.

* * * * *